United States Patent
Chiu

(10) Patent No.: US 11,121,062 B2
(45) Date of Patent: Sep. 14, 2021

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 52 days.

(21) Appl. No.: 16/211,830

(22) Filed: Dec. 6, 2018

(65) Prior Publication Data

US 2020/0161219 A1    May 21, 2020

Related U.S. Application Data

(60) Provisional application No. 62/769,917, filed on Nov. 20, 2018.

(51) Int. Cl.
*H01L 23/48* (2006.01)
*H01L 23/528* (2006.01)
*H01L 21/768* (2006.01)
*H01L 23/532* (2006.01)

(52) U.S. Cl.
CPC ...... *H01L 23/481* (2013.01); *H01L 21/76877* (2013.01); *H01L 23/528* (2013.01); *H01L 23/53238* (2013.01)

(58) Field of Classification Search
CPC ....... H01L 23/528–5286; H01L 23/481; H01L 21/76898; H01L 2225/06541–06548; H01L 27/0688–0694; H01L 21/76877–76883

See application file for complete search history.

(56) References Cited

U.S. PATENT DOCUMENTS

| | | | |
|---|---|---|---|
| 2006/0118965 A1 | 6/2006 | Matsui | |
| 2009/0108464 A1* | 4/2009 | Uchiyama | H01L 23/481 257/774 |
| 2009/0212438 A1 | 8/2009 | Kreupl et al. | |
| 2011/0189852 A1 | 8/2011 | Wang et al. | |
| 2012/0018893 A1* | 1/2012 | Oganesian | B24C 1/045 257/773 |
| 2016/0276169 A1* | 9/2016 | Zhong | H01L 21/321 |

FOREIGN PATENT DOCUMENTS

| | | |
|---|---|---|
| CN | 102856299 A | 1/2013 |
| KR | 20150016798 A | 2/2015 |
| TW | 1575688 B | 3/2017 |
| TW | I575688 B | 3/2017 |

OTHER PUBLICATIONS

Office Action dated Jan. 3, 2020 related to Taiwanese Application No. 107147721.

* cited by examiner

*Primary Examiner* — Amar Movva
(74) *Attorney, Agent, or Firm* — Muncy, Geissler, Olds and Lowe, P.C.

(57) ABSTRACT

The present disclosure relates to a semiconductor device and method of manufacturing the same. The semiconductor device includes a substrate and a through silicon via structure. The through silicon via is disposed in the substrate and includes an insulation layer and a plurality of conductive lines. The conductive lines are separated from each other by the insulation layer and extend from a top surface of the insulation layer to a bottom surface opposite to the top surface.

8 Claims, 22 Drawing Sheets

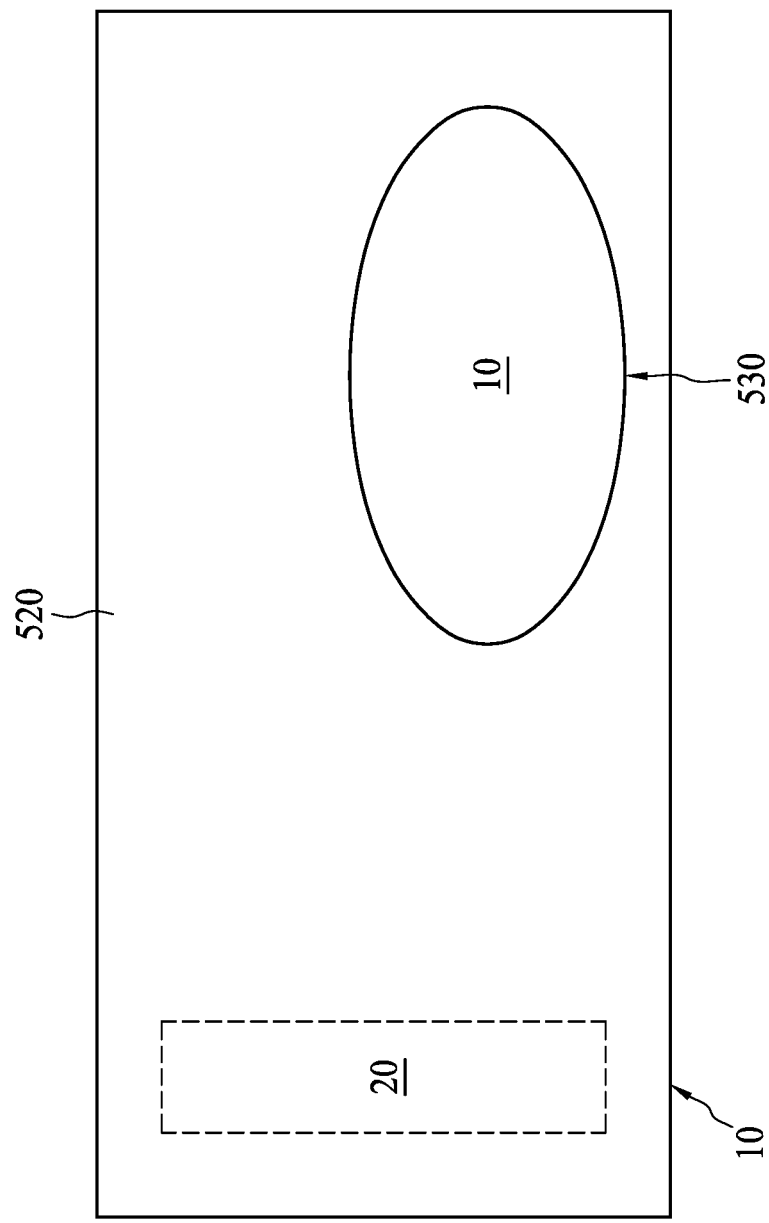

SEMICONDUCTOR DEVICE AND METHOD FOR MANUFACTURING THE SAME

PRIORITY CLAIM AND CROSS-REFERENCE

This application claims the priority benefit of U.S. provisional application Ser. No. 62/769,917, filed on Nov. 20, 2018. The entirety of the above-mentioned patent application is hereby incorporated by reference herein and made a part of this specification.

TECHNICAL FIELD

The present disclosure relates to a semiconductor device and a method of manufacturing the same, and more particularly, to a semiconductor device having a through silicon via structure and a method of manufacturing the same.

DISCUSSION OF THE BACKGROUND

Two-dimensional (2D) approaches have been traditionally applied for IC integration. Continuous demand for new IC packages that can fulfill the consumer market requirements for increased functionality and performance with reduced size and cost has driven the semiconductor industry to develop more innovative packaging, using vertical, three-dimensional (3D) integration.

General advantages of 3D packaging technologies include form factor miniaturization (reduction of size and weight), integration of heterogeneous technologies in a single package, replacement of lengthy 2D interconnects with short vertical interconnects, and the reduction of power consumption.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate and a through silicon via structure disposed in the substrate. The through silicon via structure includes an insulation layer and a plurality of conductive lines. The conductive lines extend from a top surface of the insulation layer to a bottom surface opposite to the top surface. The conductive lines are separated from each other by the insulation layer.

In some embodiments, the insulation layer penetrates through the substrate.

In some embodiments, the bottom surface of the insulation layer is coplanar with a rear surface of the substrate.

In some embodiments, a height of each of the plurality of conductive lines is in a range of 30 to 50 micrometers.

In some embodiments, the semiconductor device further includes a semiconductor component and a dielectric layer, wherein the semiconductor component is disposed on the substrate, the dielectric layer is disposed on the substrate and encircles the semiconductor component, and the through silicon via structure penetrates through the dielectric layer.

In some embodiments, a top surface of the insulation layer is coplanar with an upper surface of the dielectric layer.

In some embodiments, the semiconductor device further includes a barrier layer disposed between the insulation layer and the conductive lines.

In some embodiments, the semiconductor device further includes a seed layer disposed between the barrier layer and the conductive lines.

In some embodiments, the insulation layer is a spin-on-glass (SOG) layer.

Another aspect of the present disclosure provides a method of manufacturing a semiconductor device. The method includes steps of: providing a substrate; forming an opening in the substrate; depositing an insulation layer in the opening; forming a plurality of trenches separated from each other in the insulation layer; and depositing a conductive material in the trenches.

In some embodiments, the method further includes steps of: forming a semiconductor component on the substrate; and, before the forming of the opening, depositing a dielectric layer on the substrate, wherein the dielectric layer surrounds the semiconductor component and the opening penetrates through the dielectric layer.

In some embodiments, the method further includes a step of performing a planarizing process to planarize the insulation layer and the conductive material until the dielectric layer and the semiconductor component are exposed.

In some embodiments, the method further includes steps of: before the forming of the openings, forming a stop layer on the dielectric layer and the semiconductor component; before the deposition of the conductive material, performing a first planarizing process to planarize the insulation layer until the stop layer is exposed; and performing a second planarizing process to planarize the insulation layer and the conductive material and to remove the stop layer.

In some embodiments, a top surface of the insulation layer is coplanar with a top surface of the semiconductor component after the performing of the second planarizing process.

In some embodiments, the method further includes a step of depositing a barrier layer in the trenches before the deposition of the conductive material.

In some embodiments, the barrier layer has a uniform thickness.

In some embodiments, the method further includes a step of forming a seed layer on the barrier layer before the deposition of the conductive material.

In some embodiments, a portion of the substrate is exposed to the trenches.

In some embodiments, the method further includes a step of performing a grinding process to expose a bottom surface of the insulation layer.

With the above-mentioned configurations of the semiconductor device, a parasitic capacitance of the through silicon via structure is reduced because the conductive lines are separated from each other by the insulation layer, and the speed of the signal transmission through the through silicon via structure is thus increased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 7A and 7B are top views of intermediate stages in the manufacture of the semiconductor device in accordance with some embodiments of the present disclosure.

DETAILED DESCRIPTION

Figure 1:
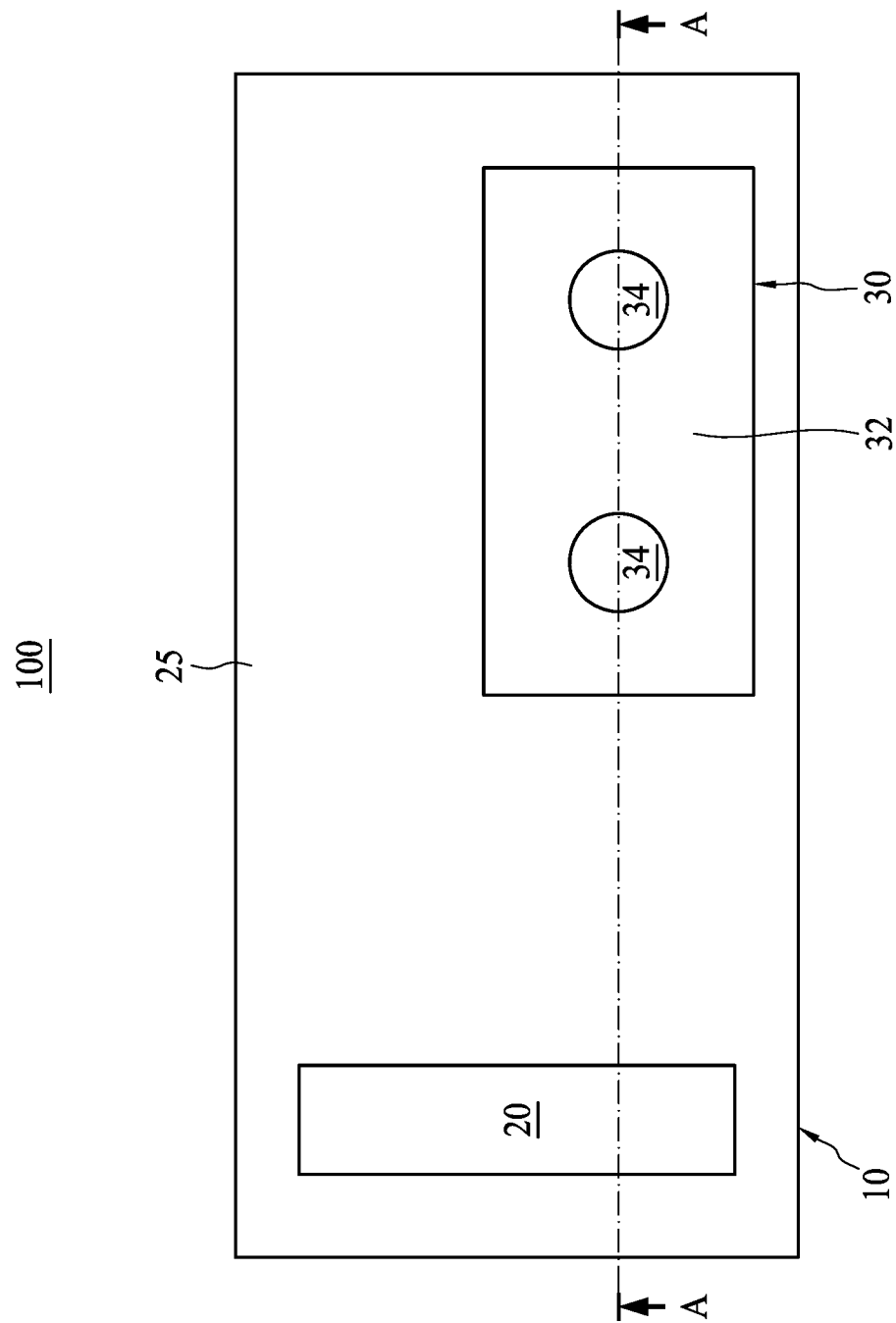
FIG. 1 is a top view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
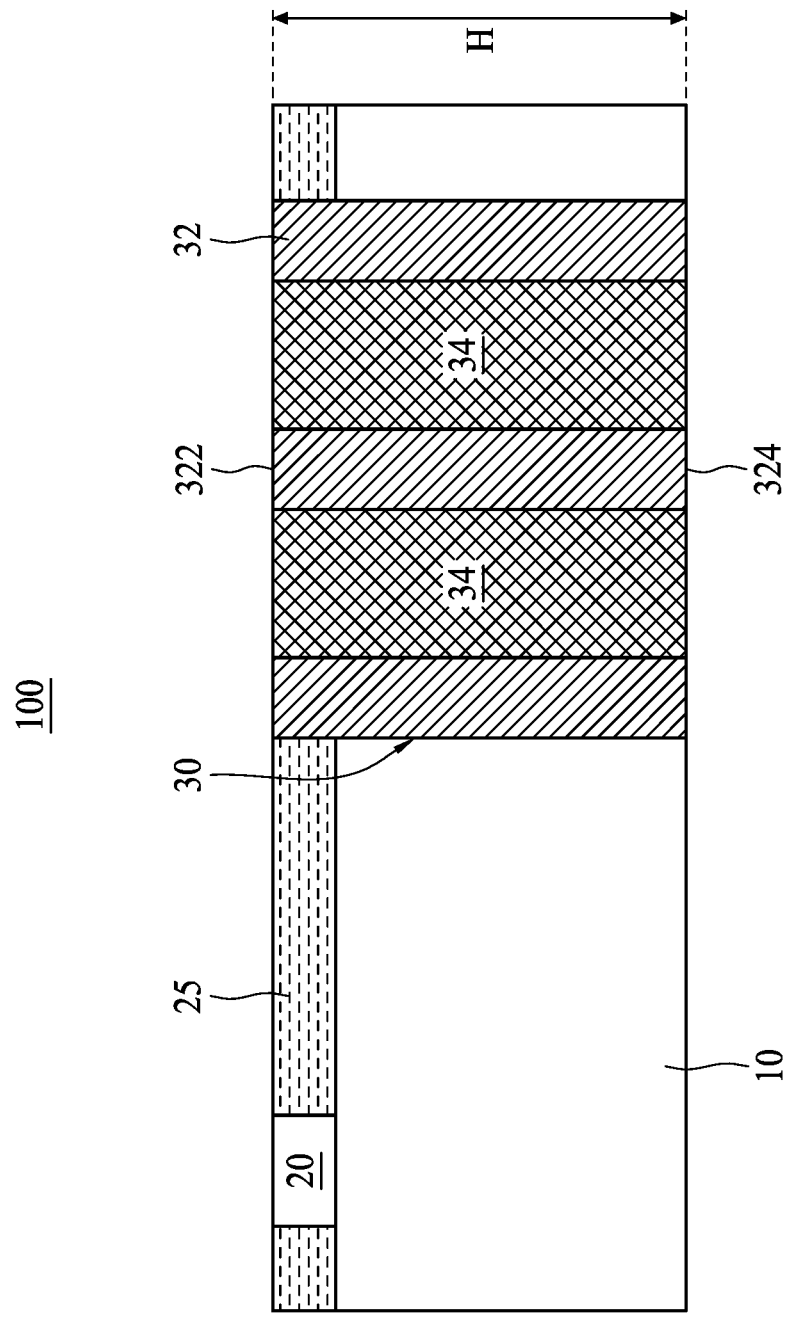
FIG. 2 is a cross-sectional view taken along the line A-A illustrated in FIG. 1.

FIG. 1 is a top view of a semiconductor device 100 in accordance with some embodiments of the present disclosure, and FIG. 2 is a cross-sectional view of the semiconductor device 100 in accordance with some embodiment of the present disclosure. Referring to FIG. 1 and FIG. 2, the semiconductor device 100 includes a semiconductor substrate 10, at least one semiconductor component 20 disposed on the semiconductor substrate 10, a dielectric layer 25 disposed on the semiconductor substrate 10 and encircling the semiconductor component 20, and a through silicon via structure 30 penetrating through the dielectric layer 25 and through the semiconductor substrate 10.

In some embodiments, the semiconductor component 20 is, for example, a metal-oxide-semiconductor (MOS) transistor. In some embodiments, the dielectric layer 25 includes oxide. In some embodiments, the through silicon via structure 30 is formed after creating the semiconductor component 20. In some embodiments, the through silicon via structure 30 penetrates through the semiconductor substrate 10. In some embodiments, the through silicon via structure 30 includes an insulation layer 32 and a plurality of conductive lines 34 disposed in the insulation layer 32. In some embodiments, the conductive lines 34 are insulated from each other by the insulation layer 32. In some embodiments, each of the conductive lines 34 extends from a top surface 322 of the insulation layer 32 to a bottom surface 324 opposite to the top surface 322. In some embodiments, the conductive lines 34 penetrate through the insulation layer 32. In some embodiments, a height H of each of the conductive lines 34 is in a range of 30 to 50 micrometers.

Figure 3:
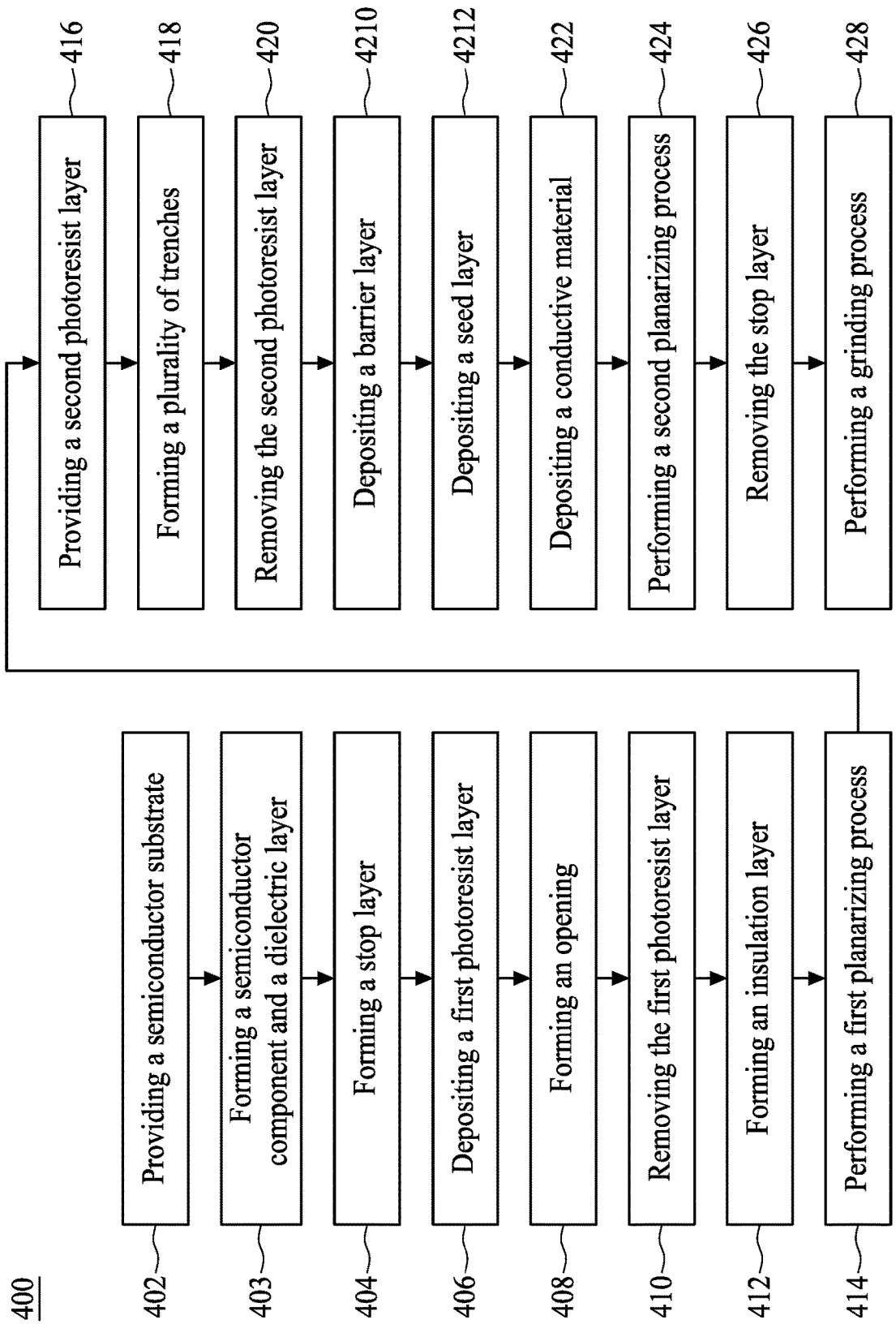
FIG. 3 is a flow diagram illustrating a method of manufacturing semiconductor devices in accordance with some embodiments of the present disclosure.

FIG. 3 is a flow diagram illustrating a method 400 for manufacturing a semiconductor device 100 in accordance with some embodiments of the present disclosure. FIGS. 4 to 16 are schematic diagrams illustrating various fabrication stages constructed according to the method 400 for manufacturing the semiconductor device 100 in accordance with some embodiments of the present disclosure. The stages shown in FIGS. 4 to 16 are also illustrated schematically in the process flow in FIG. 3. In the following discussion, the fabrication stages shown in FIGS. 4 to 17 are discussed in reference to the process steps in FIG. 3.

Figure 4:
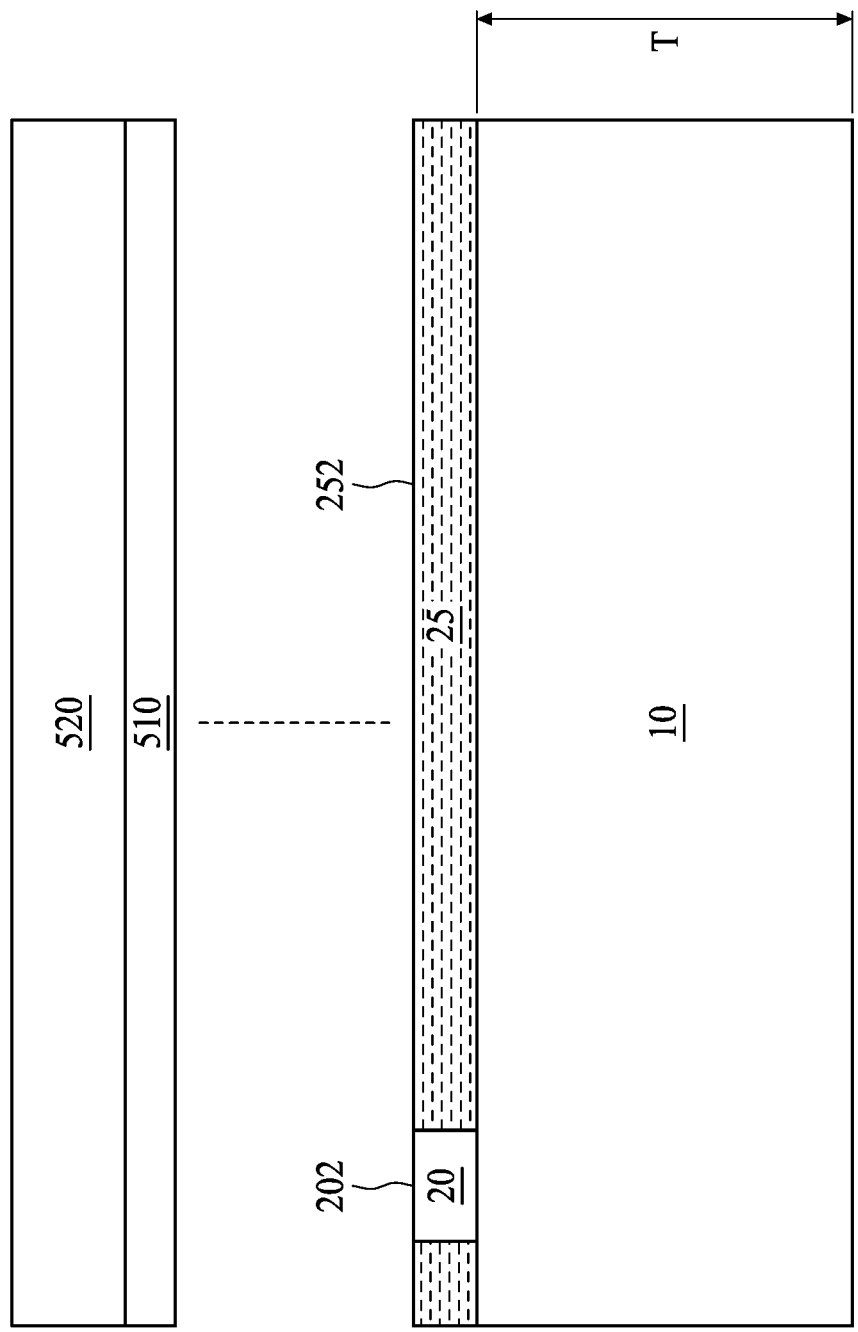
FIGS. 4 through 6 are cross-sectional views of intermediate stages in the manufacture of a semiconductor device in accordance with some embodiments of the present disclosure.

Referring to FIG. 4, a semiconductor substrate 10 is provided according to a step 402 in FIG. 3. The semiconductor substrate 10 may be a bulk substrate, which may include silicon, silicon germanium, silicon carbon, gallium arsenide, III-V compound semiconductor materials, or the like. In some embodiments, a thickness T of the semiconductor substrate 10 is greater than 700 micrometers. In some embodiments, the semiconductor substrate 10 is substantially 755 micrometers.

Next, a semiconductor component 20 and a dielectric layer 25 are formed according to a step 403 in FIG. 3. In some embodiments, the semiconductor component 20 may be a MOS transistor. In some embodiments, the semiconductor component 20 may be formed using conventional process steps. After the forming of the semiconductor component 20, the dielectric layer 25 is deposited on the semiconductor substrate 10 so as to surround the semiconductor component 20. In some embodiments, a top surface 202 of the semiconductor component 20 may be coplanar with a top surface 252 of the dielectric layer 25. In some embodiments, the dielectric layer 25 may be formed of oxide, such as phospho-silicate glass (PSG), boro-silicate glass (BSG), boron-doped phospho-silicate glass (BPSG), tetraethyl orthosilicate (TEOS) oxide, or the like.

Figure 5:
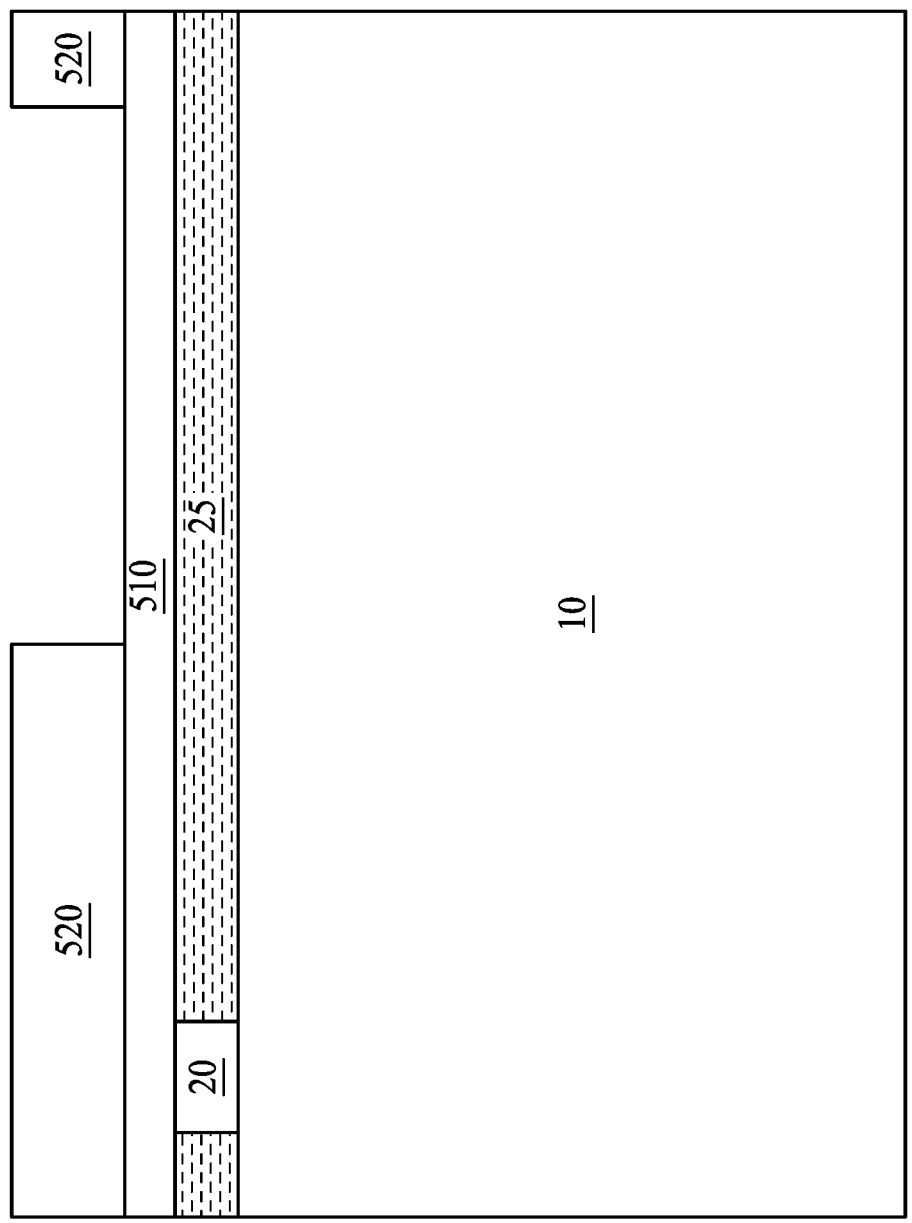

Next, in some embodiments, a stop layer 510 is formed over the semiconductor substrate 10 according to a step 404 in FIG. 3. In some embodiments, the stop layer 510 covers the semiconductor component 20 and the dielectric layer 25. In some embodiments, the stop layer 510 may be formed of silicon carbide (SiC), silicon nitride ($Si_3N_4$), silicon oxycarbide (SiCO), or a similar protective material. Thereafter, a first photoresist layer 520 is deposited on the stop layer 510 according to a step 406 in FIG. 3. The first photoresist layer 520 is then patterned to expose a portion of the stop layer 510, as shown in FIG. 5. In some embodiments, the semiconductor component 20 is protected by the remaining portion of the photoresist layer 520.

Figure 6:
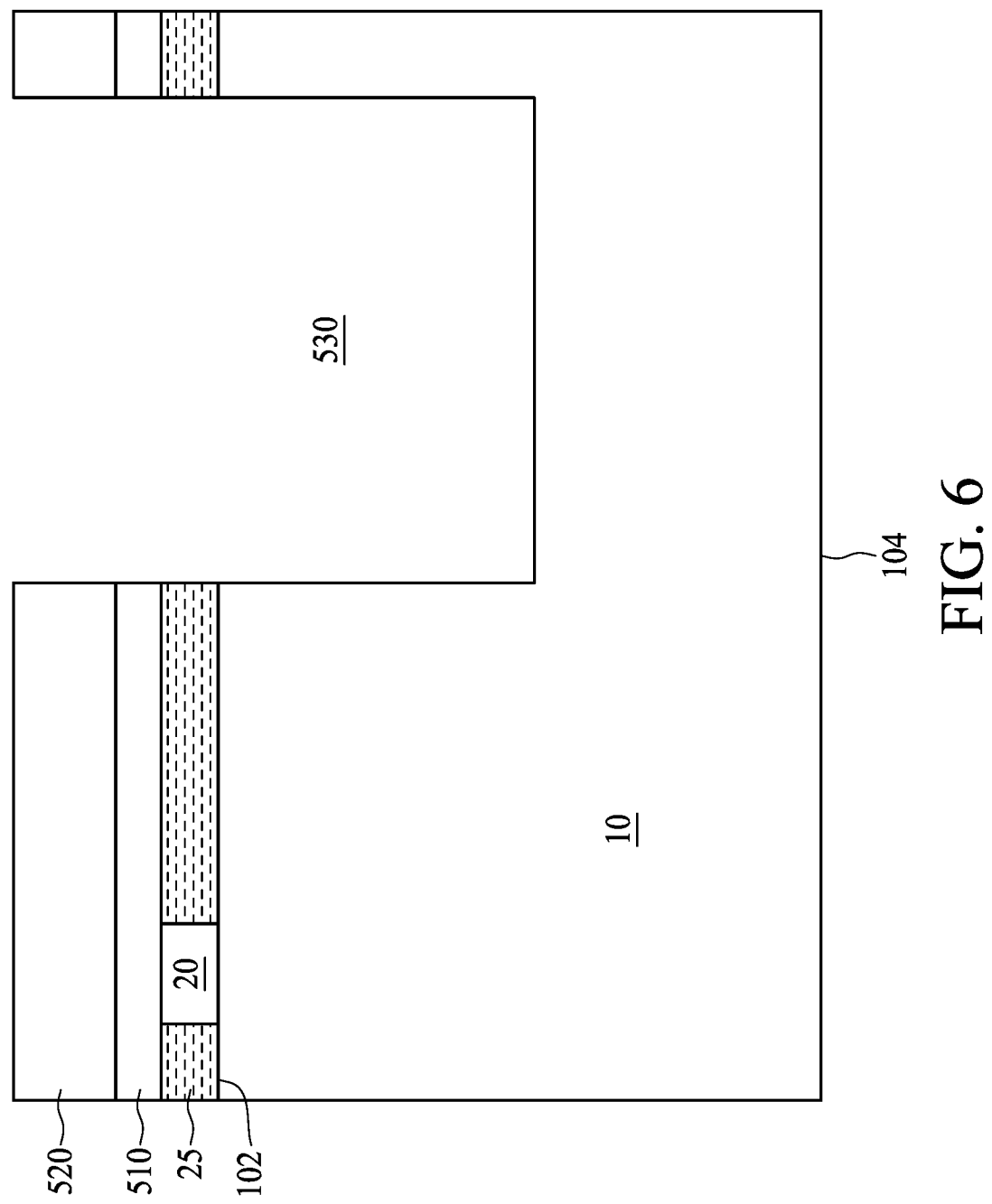
Figure 7A:
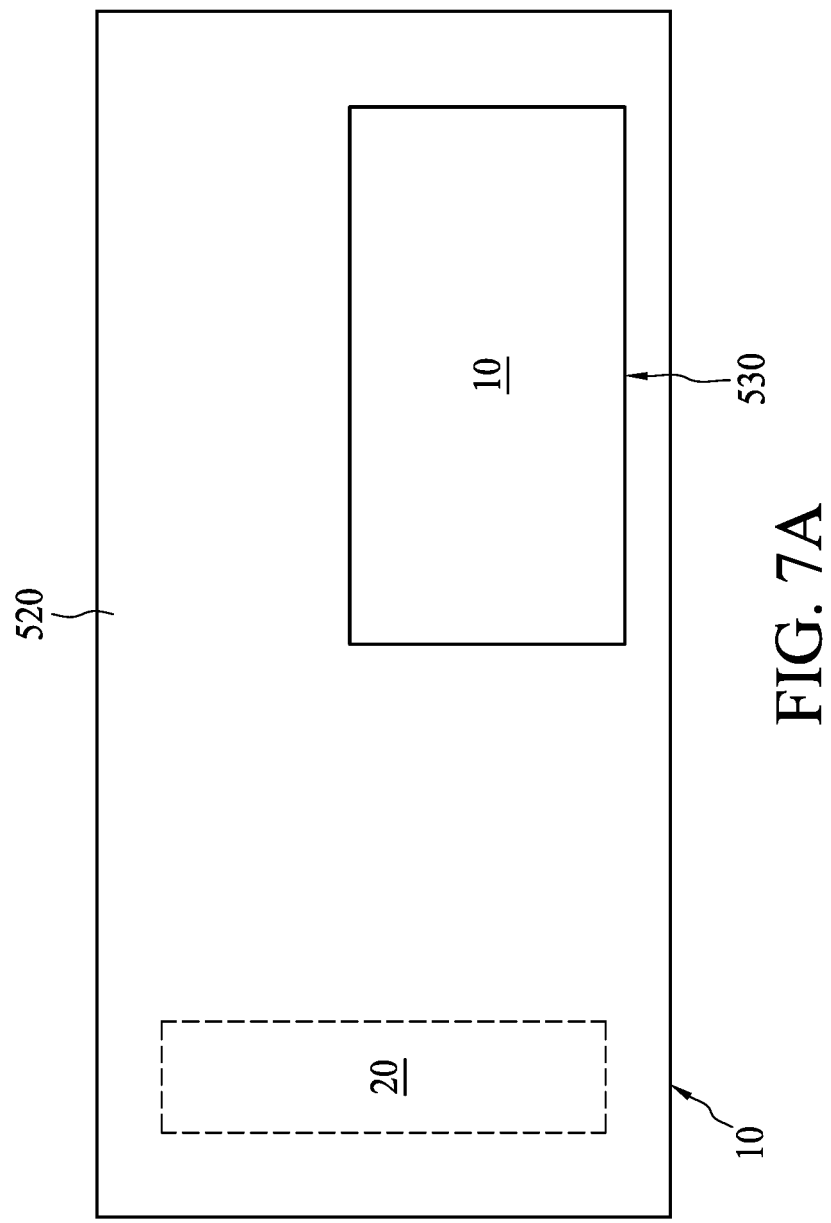

Referring to FIG. 6, in some embodiments, a first patterning process is performed to etch the stop layer 510, the dielectric layer 25, and the semiconductor substrate 10 and thus create an opening 530 in the semiconductor substrate 10 and the dielectric layer 25 according to a step 408 in FIG. 3. In some embodiments, the opening 530 is formed by removing the portion of the stop layer 510 exposed through the first photoresist layer 520 and portions of the dielectric layer 25 and the semiconductor substrate 10 beneath the exposed portion of the stop layer 510. In some embodiments, the opening 530 extends to an intermediate level between a front surface 102 of the semiconductor substrate 10 and a back surface 104 opposite to the front surface 102. In some embodiments, the opening 530 may be a rectangular opening, as shown in FIG. 7A. In some embodiments, the opening 530 may be an ellipsoid opening (as shown in FIG. 7B) or an opening of another shape. In some embodiments, the semiconductor substrate 10 is patterned using an etching process, such as a reactive ion etching (RIE) process.

Figure 8:
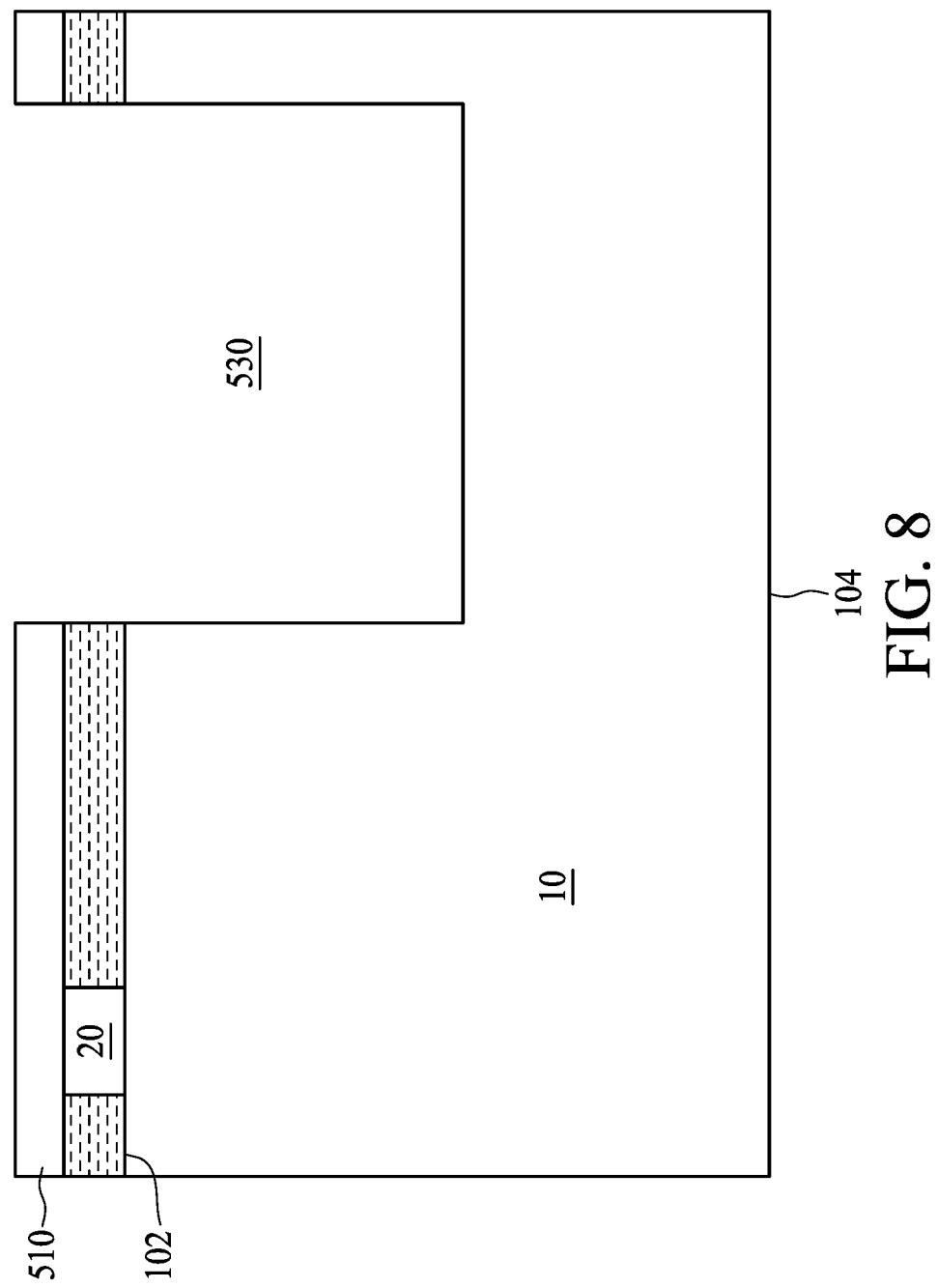
FIGS. 8 through 16 are cross-sectional views of intermediate stages in the manufacture of the semiconductor device in accordance with some embodiments of the present disclosure.

As shown in FIG. 8, the first photoresist layer 520 is removed according to a step 410 in FIG. 3. In some embodiments, an ashing process or a wet strip process may be used to remove the first photoresist layer 520.

Figure 9:
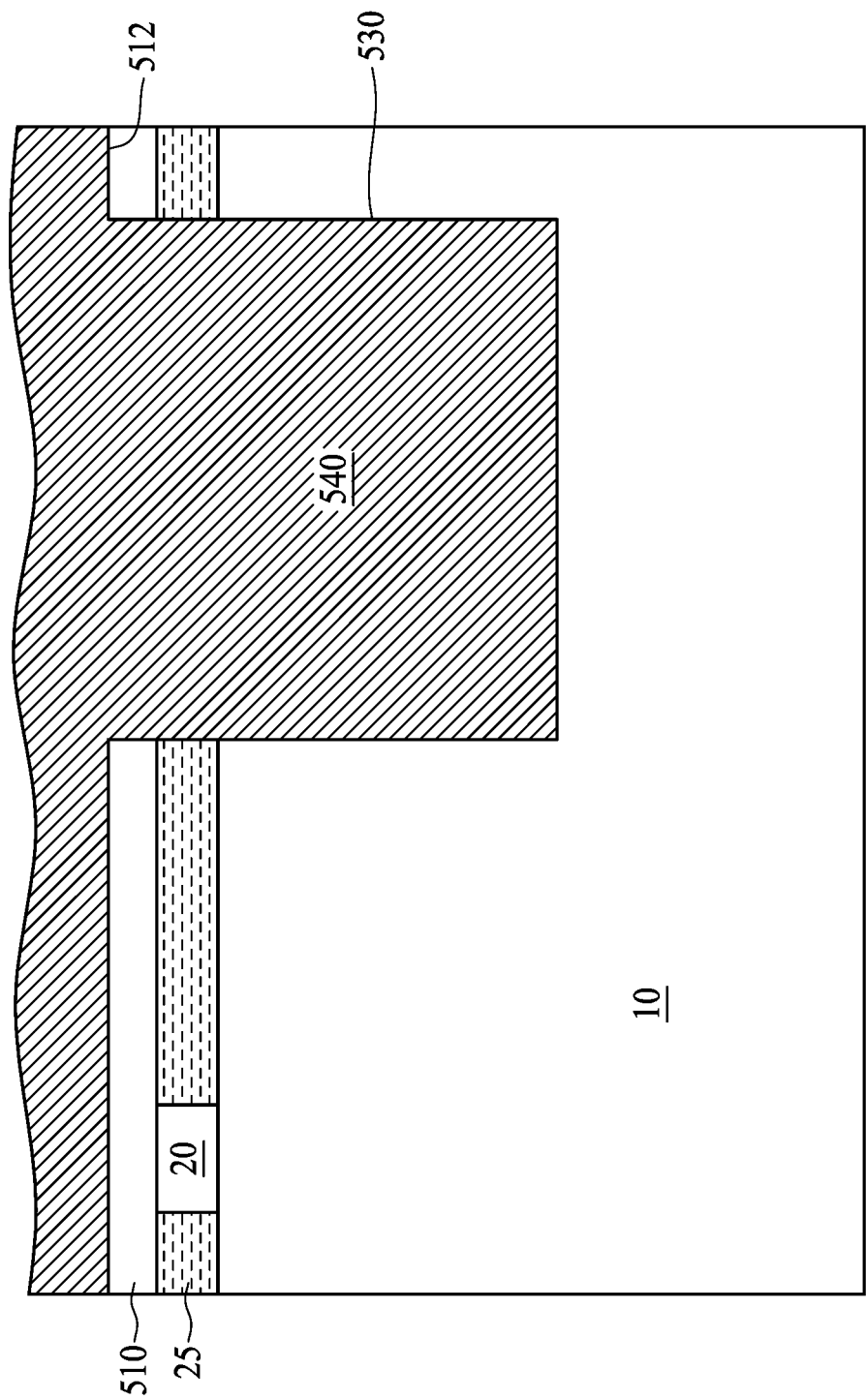

Referring to FIG. 9, in some embodiments, an insulation layer 540 is formed in the opening 530 according to a step 412 in FIG. 3. In some embodiments, the insulation layer 540 is formed by a spin coating process, for example, which offers simplicity, better opening filling and better planarization than a chemical vapor deposition (CVD) process. In some embodiments, before the spin coating of the insulation layer 540, a spin-on-glass (SOG) solution is formed by dissolving or suspending an insulation material into solvent, the formed SOG solution is spin-coated onto an upper surface 512 of the stop layer 510 and into the opening 530 to form the insulation layer 540, and the insulation layer 540 is baked or cured for condensation. In some embodiments, the insulation layer 540 may be formed of an oxide such as silicon dioxide. In some embodiments, the insulation layer 540 is a spin-on glass (SOG) layer.

Figure 10:
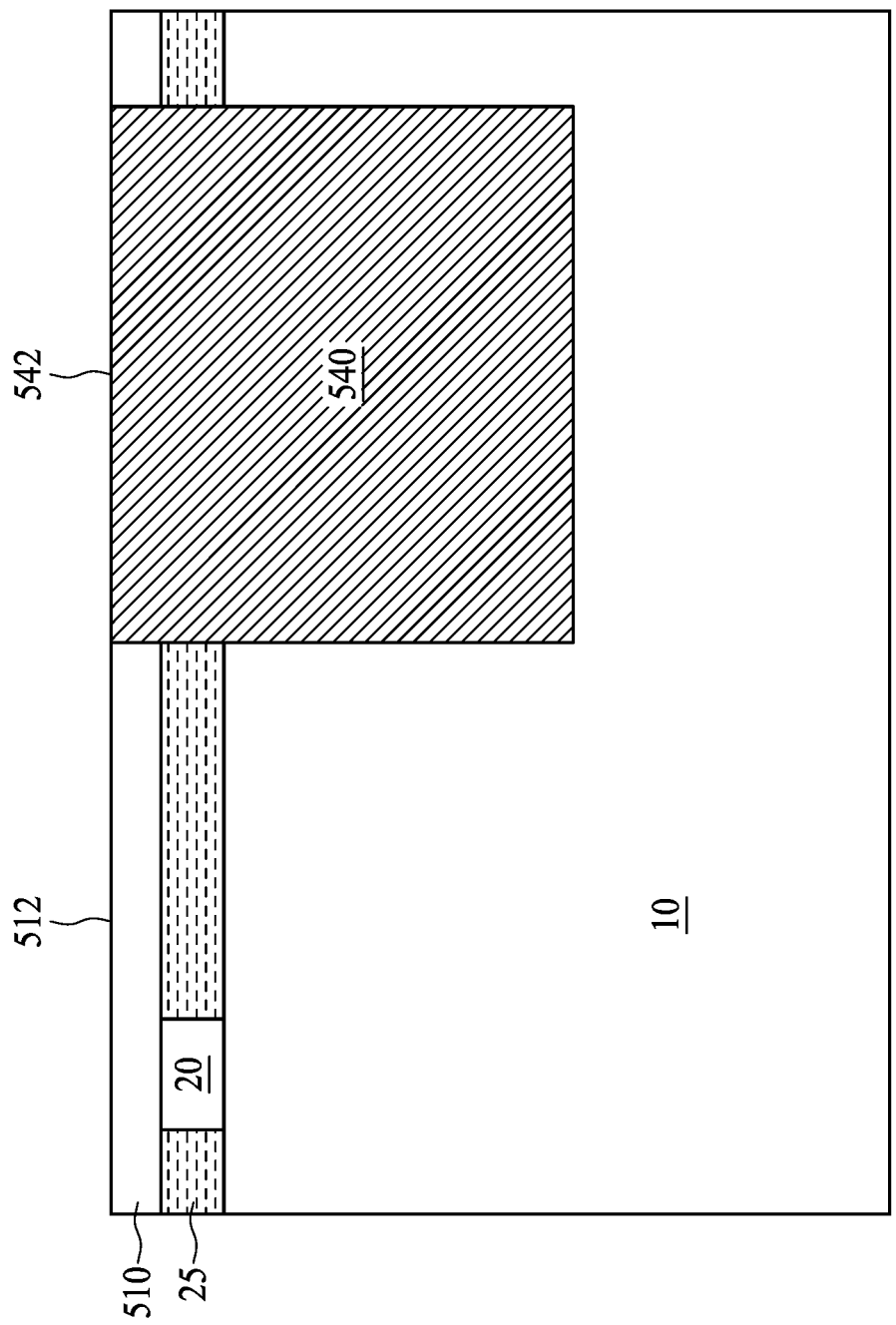

Referring to FIG. 10, in some embodiments, a first planarizing process is performed to remove excess portions of the insulation layer 540 according to a step 414 in FIG. 3. In some embodiments, the first planarizing process stops at the stop layer 510. In some embodiments, the first planarizing process removes the insulation layer 540 located over the stop layer 510. In the resulting structure, an upper surface 542 of the insulation layer 540 is coplanar with the upper surface 512. In some embodiments, the first planarizing process is, for example, a chemical mechanical polish (CMP) process.

Figure 11:
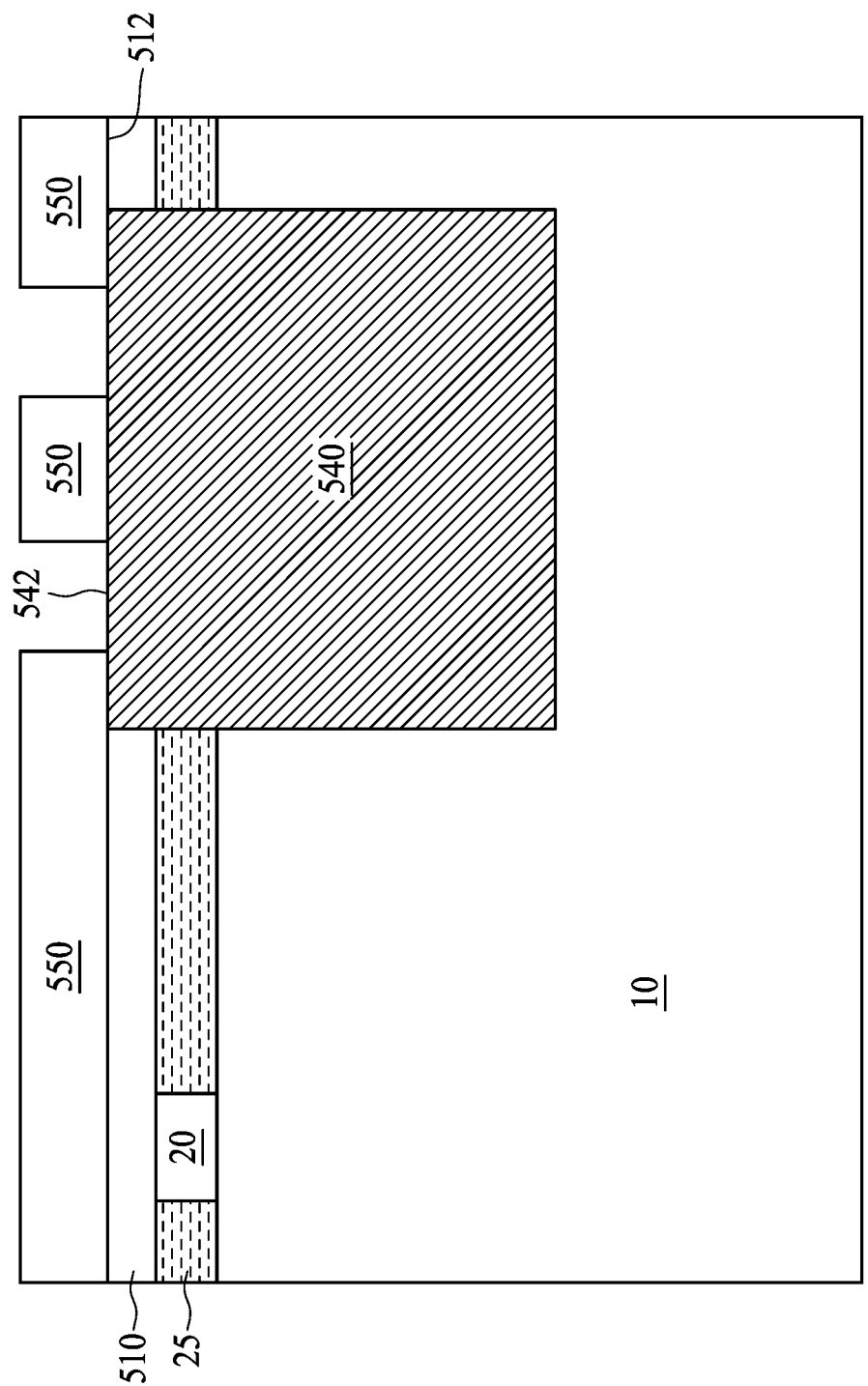

Referring to FIG. 11, in some embodiments, a second photoresist layer 550 is provided on the upper surface 512 of the stop layer 510 and the upper surface 542 of the insulation layer 540 according to a step 416 in FIG. 3. In some embodiments, the second photoresist layer 550 is then patterned to expose portions of the upper surface 542. In some embodiments, the stop layer 510 is protected by the remaining second photoresist layer 550.

Figure 12:
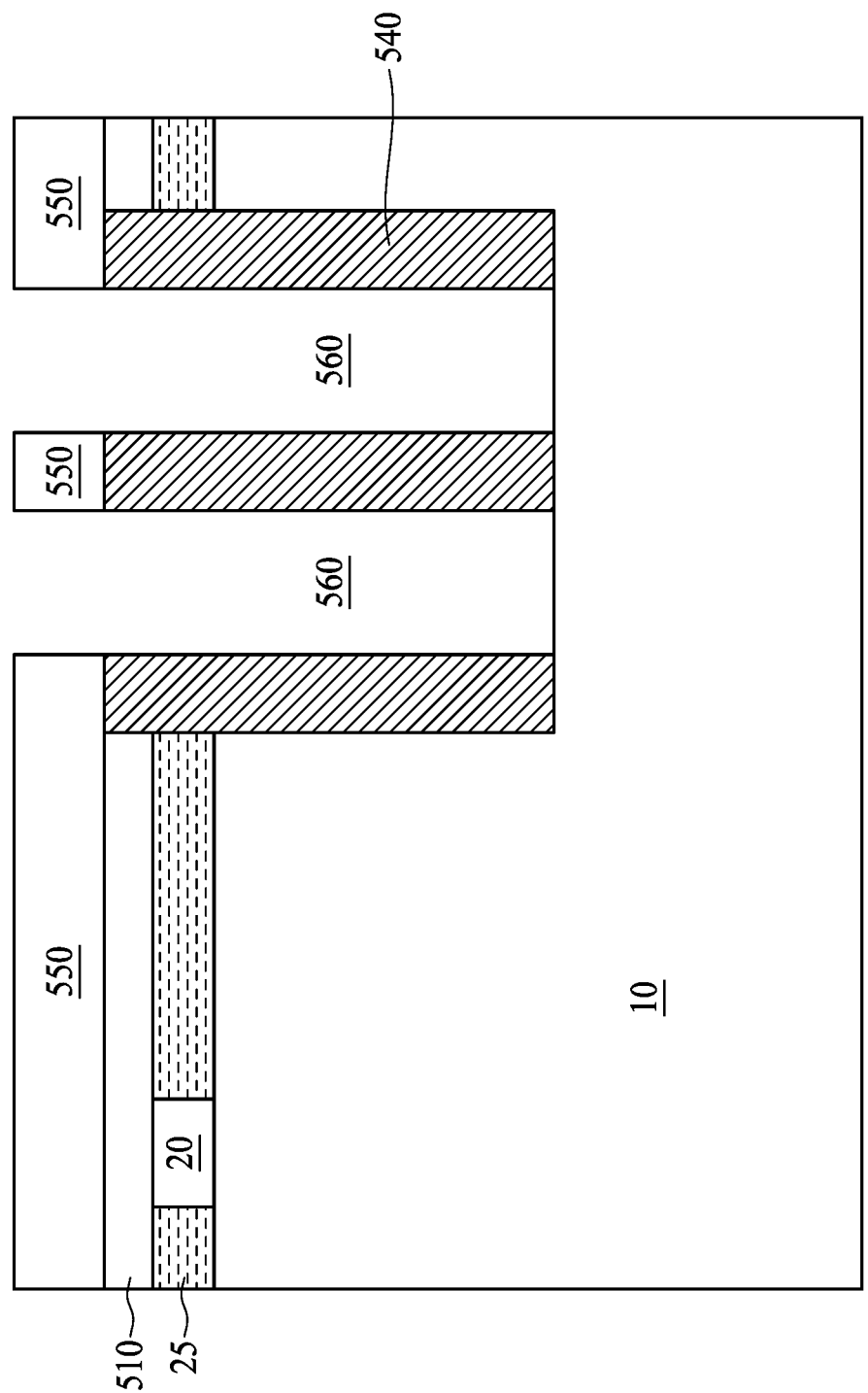

Referring to FIG. 12, a second patterning process is performed to form a plurality of trenches 560 according to a step 418 in FIG. 3. In the resulting structure, a portion of the semiconductor substrate 10 is exposed to the trenches 560. In some embodiments, the insulation layer 540 is patterned using an RIE process. In some embodiments, the trenches 560 are separated from each other by the insulation layer 540.

Figure 13:
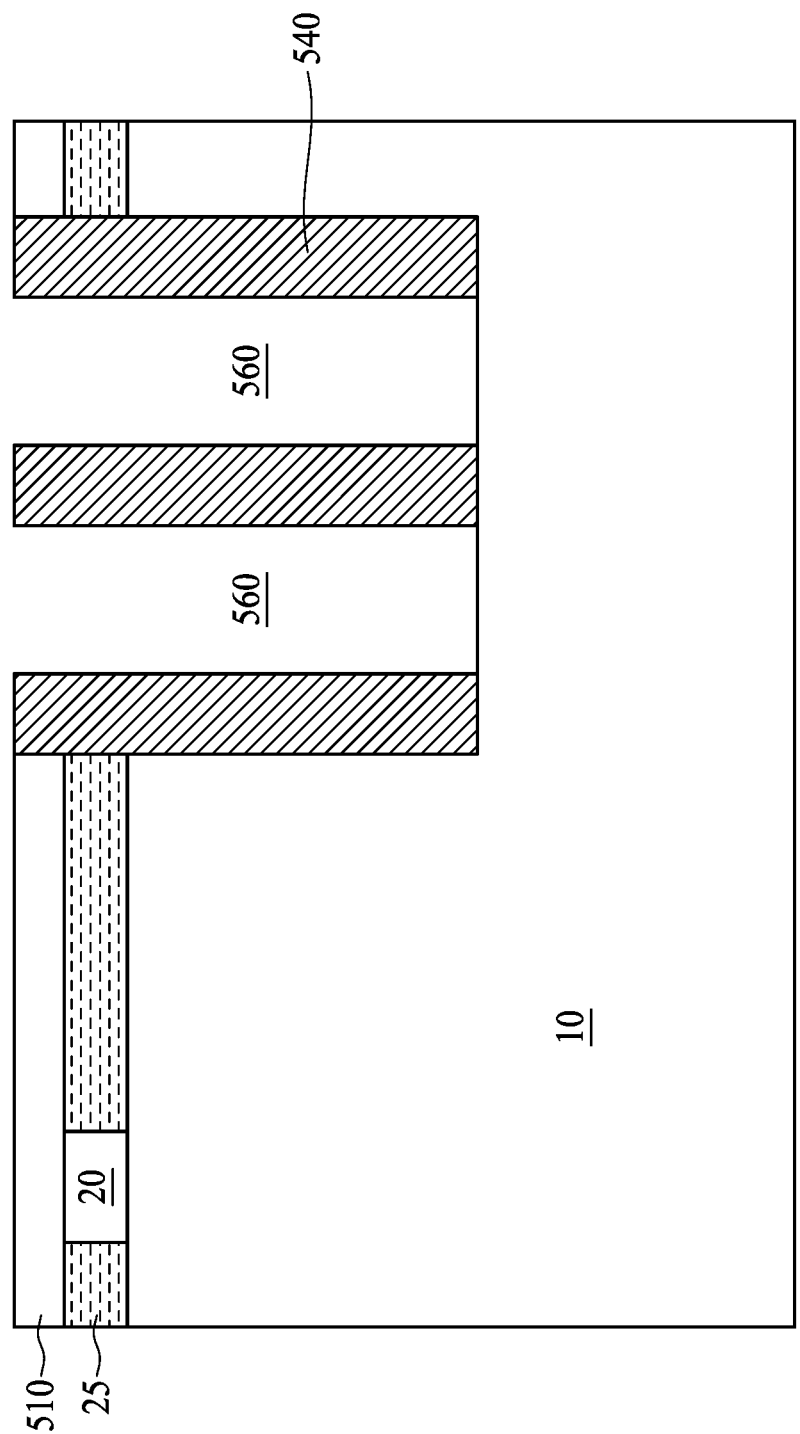

Referring to FIG. 13, in some embodiments, the second photoresist layer 550 is removed according to a step 420 in FIG. 3. In some embodiments, the second photoresist layer 550 is removed, for example, through an ashing process or a wet etching process.

Figure 14:
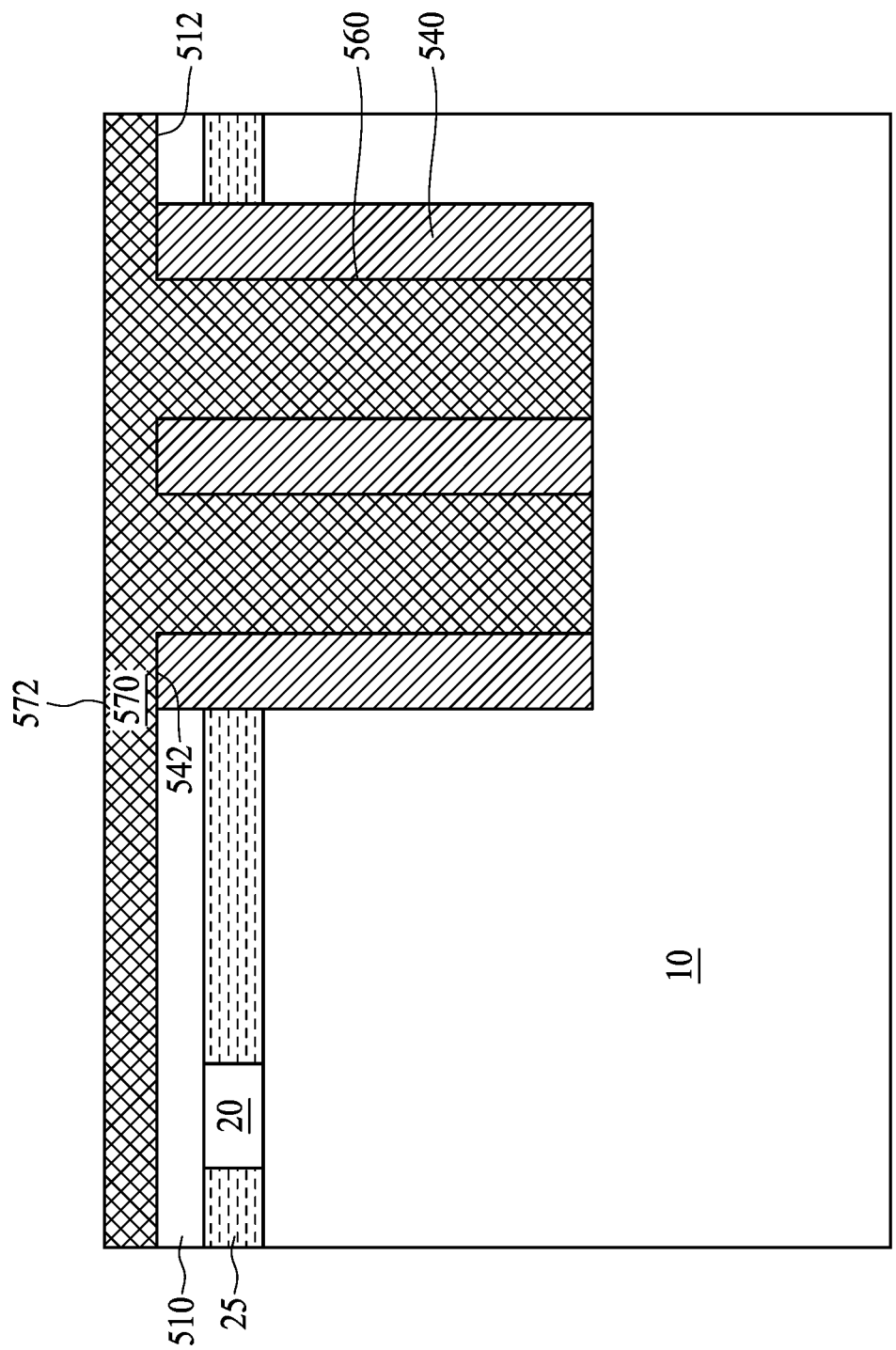

Referring to FIG. 14, in some embodiments, a conductive material 570 is deposited into the trenches 560 according to a step 422 in FIG. 3. In some embodiments, the conductive material 570 is deposited in the trenches 560 until an upper surface 572 thereof is higher than the upper surfaces 512 and 542. In some embodiments, the conductive material 570 includes copper or a copper alloy, although other types of conductive materials, including aluminum, silver, gold, tungsten, or a combination thereof, may also be used. In some embodiments, the formation methods of the conductive layer 570 include a plating process (such as an electroplating process), a CVD process, a physical vapor deposition (PVD) process or a sputtering process.

Figure 15:
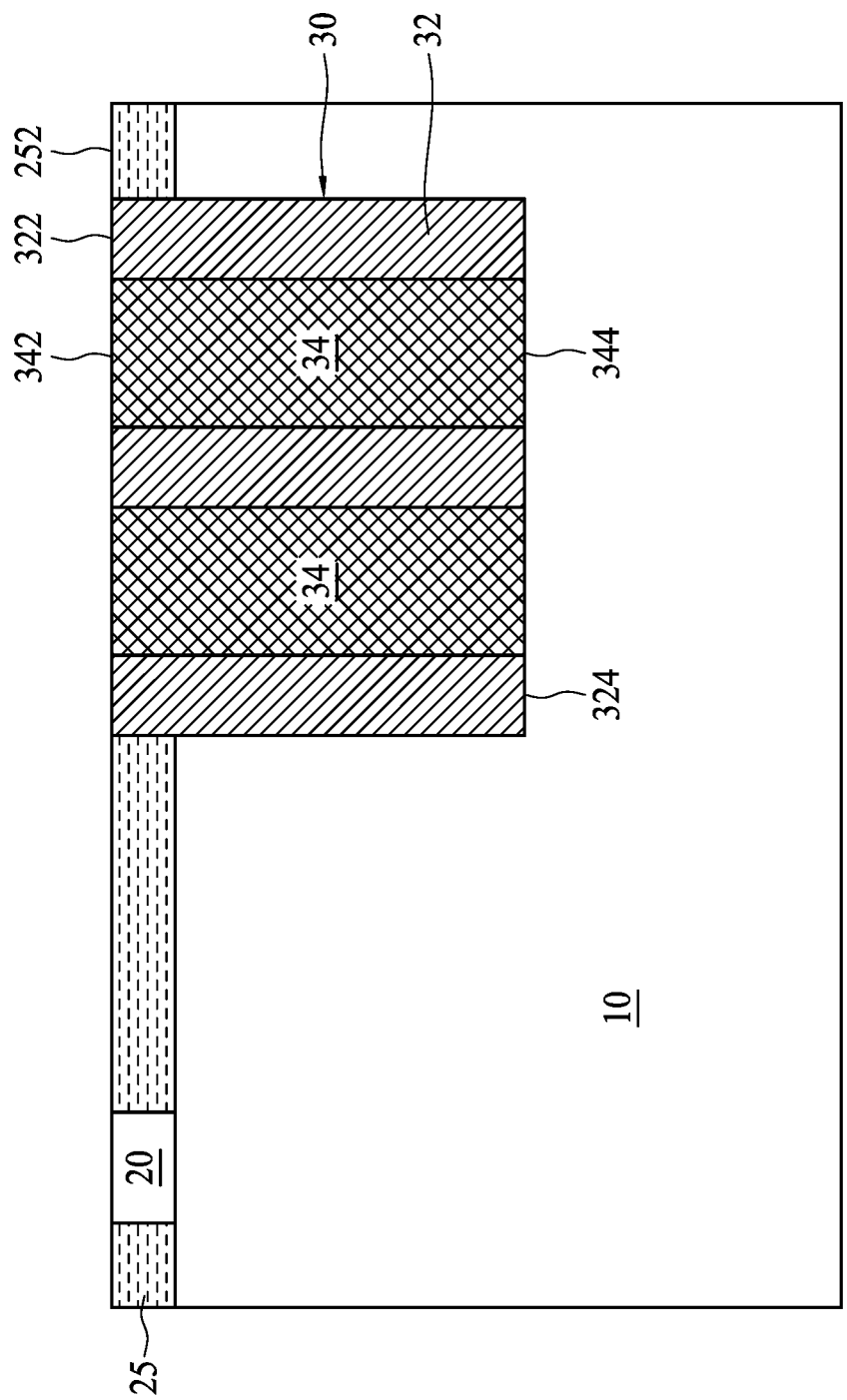

Referring to FIG. 15, in some embodiments, a second planarizing process is performed to expose the stop layer 510 according to a step 424 in FIG. 3. Next, the stop layer 510 is removed to expose the dielectric layer 25 according to a step 426 in FIG. 3. Accordingly, the through silicon via structure 30 is formed. In some embodiments, the insulation layer 540, the conductive material 570, and the stop layer 510 shown in FIG. 14 are planarized until the dielectric layer 25 and the semiconductor components 20 are exposed. In some embodiments, the through silicon via 30 includes the remaining insulation layer 32 and a plurality of conductive lines 34 separated from each other by the remaining insulation layer 32. In the resulting structure, a top surface 322 of the remaining insulation layer 32 is coplanar with the top surface 252 of the dielectric layer 25. In some embodiments, a top surface 342 of each of the conductive lines 34 is coplanar with the top surface 252. In some embodiments, a bottom surface 344 of the conductive line 34, opposite to the top surface 342, is connected to the semiconductor substrate 10. In some embodiments, a bottom surface 324 of the remaining insulation layer 32 is coplanar with the bottom surface 344. In some embodiments, the second planarizing process is, for example, a CMP process.

Figure 16:
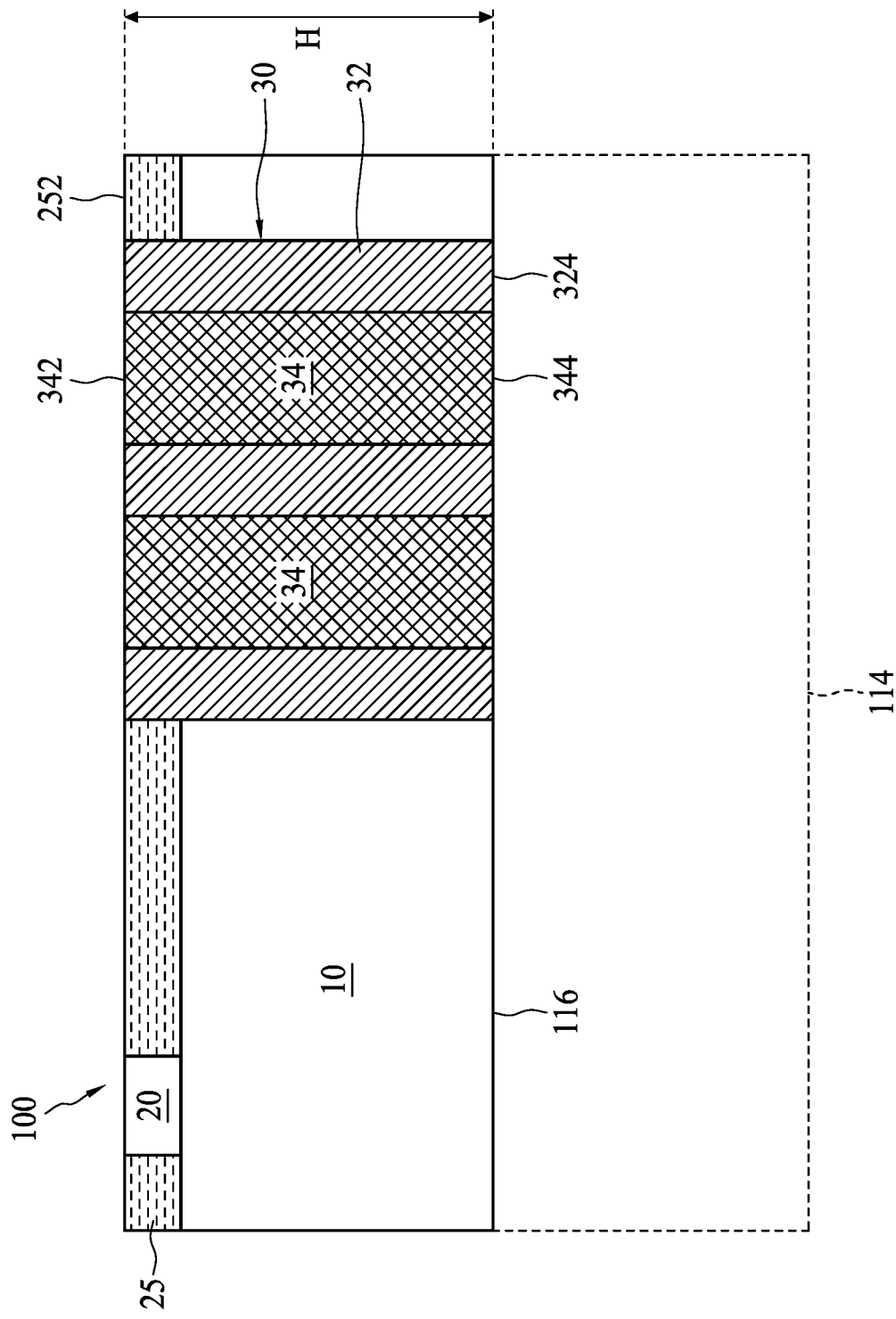

Referring to FIG. 16, in some embodiments, a grinding process is optionally performed from a back surface 114 of the semiconductor substrate 10 according to a step 428 in FIG. 3. Accordingly, the semiconductor device 100 is completely formed. In some embodiments, the grinding process is performed until the bottom surfaces 344 of the conductive lines 34 are exposed. In some embodiments, the remaining semiconductor substrate 10 includes a rear surface 116 being coplanar with the bottom surface 344. In some embodiments, a thickness H of each of the conductive lines 34, measured from the top surface 342 to the bottom surface 344, is in a range of 30 to 50 micrometers.

In the resulting structure, the conductive lines 34 of the through silicon via structure 30 are separated from each other by the insulation layer 32, thus only a (parasitic) capacitor is formed by the two adjacent conductive lines 34 separated by the insulation layer 32. However, in the conventional through silicon via structure, conductive lines are disposed in the silicon substrate and insulated from the silicon substrate by the insulator, thus a (parasitic) capacitor is formed by the silicon substrate and each of the conductive lines. This is to say, two (parasitic) capacitors connected in parallel can be formed in the conventional through silicon via structure including two conductive lines. Thus, a capacitance of the (parasitic) capacitor of the through silicon via structure 30 of the present disclosure is less than that of the conventional through silicon via structure with the same number of conductive lines. Therefore, the speed of the signal transmission through the through silicon via structure 30 of the present disclosure is increased.

FIGS. 17 through 21 illustrate the formation of a semiconductor device 100 in accordance with some alternative embodiments of the present disclosure. Unless specified otherwise, the materials and formation methods of the components in these embodiments are essentially the same as the like components, which are denoted by like reference numerals in the embodiments shown in FIGS. 4 through 16. The details of the like components shown in FIGS. 17 through 21 may thus be found in the discussion of the embodiments shown in FIG. 4 through 16.

Figure 17:
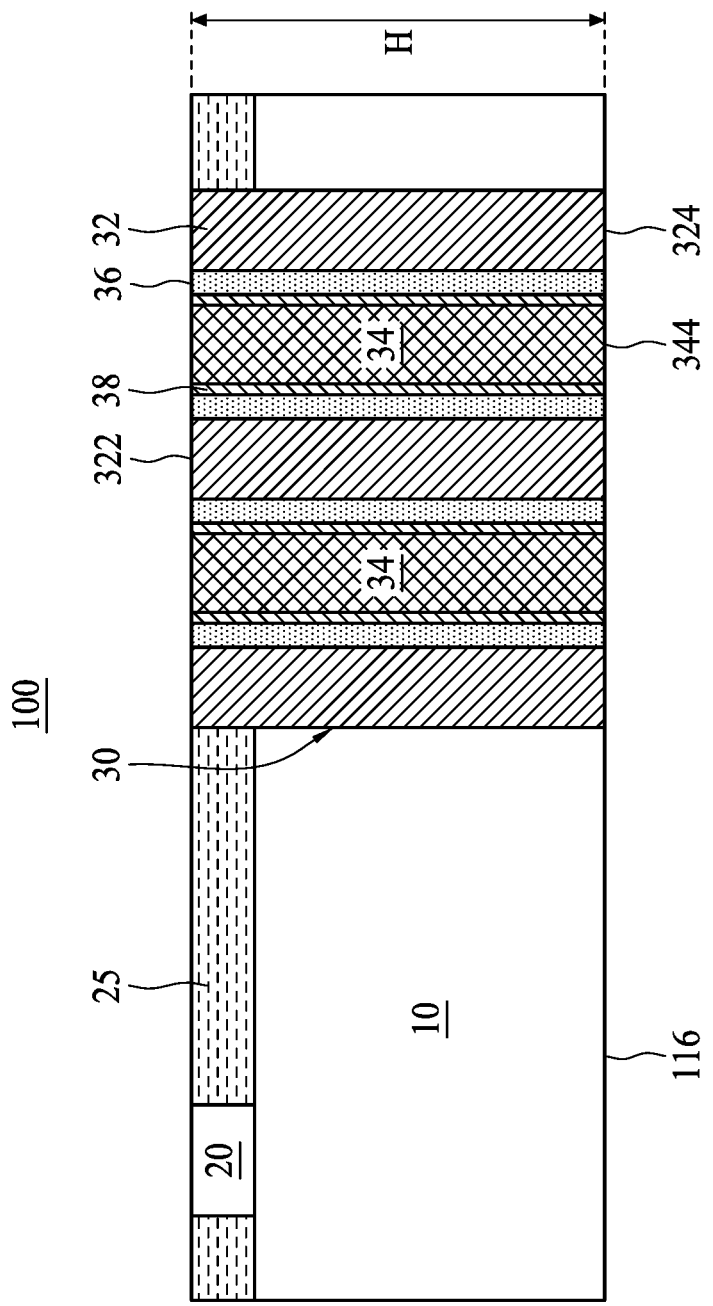
FIG. 17 illustrates a cross-sectional view of the semiconductor device in accordance with some embodiments of the present disclosure.
Figure 18:
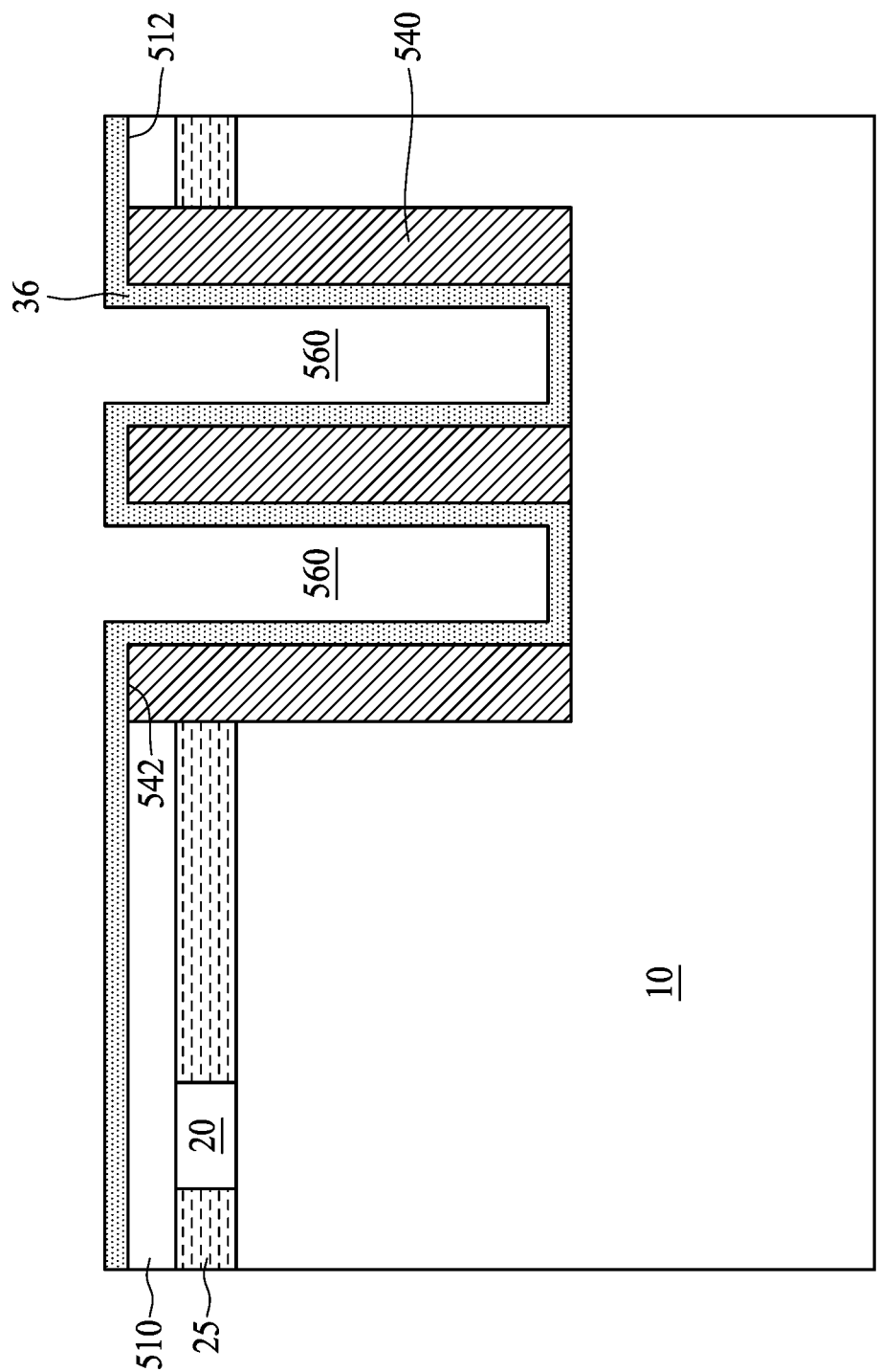
FIGS. 18 through 21 illustrate cross-sectional views of intermediate stages in the manufacture of a semiconductor device in accordance with some embodiments of the present disclosure.

Referring to FIG. 17, in some embodiments, a barrier layer 36 is disposed between the insulation layer 32 and the conductive lines 34. The formation processes for forming the barrier layer 36 is started after the second photoresist layer 550 is removed, and before the conductive material 570 is deposited into the trenches 560. Referring to FIG. 18, in some embodiments, after the second photoresist layer 550 is removed, a barrier layer 36 is deposited on the upper surfaces 512 and 542 and in the trenches 560 according to a step 4210 in FIG. 3. In some embodiments, the barrier layer 36 may improve adhesion of the conductive material, which will be formed during a subsequent process, to the insulation layer 540. In some embodiments, the barrier layer 36 is a substantially conformal layer. In some embodiments, the barrier layer 36 has a uniform thickness. In some embodiments, refractory metals, refractory metal nitrides, refractory metal silicon nitrides and combinations thereof are typically used for the barrier layer 36. In some embodiments, the barrier layer 36 may include titanium (Ti), titanium nitride (TiN), tantalum (Ta), tantalum nitride (TaN), titanium silicon nitride (TiSN), tantalum silicon nitride (TaSiN), or the like. In some embodiments, the barrier layer 36 is formed using a PVD process, for example.

Figure 19:
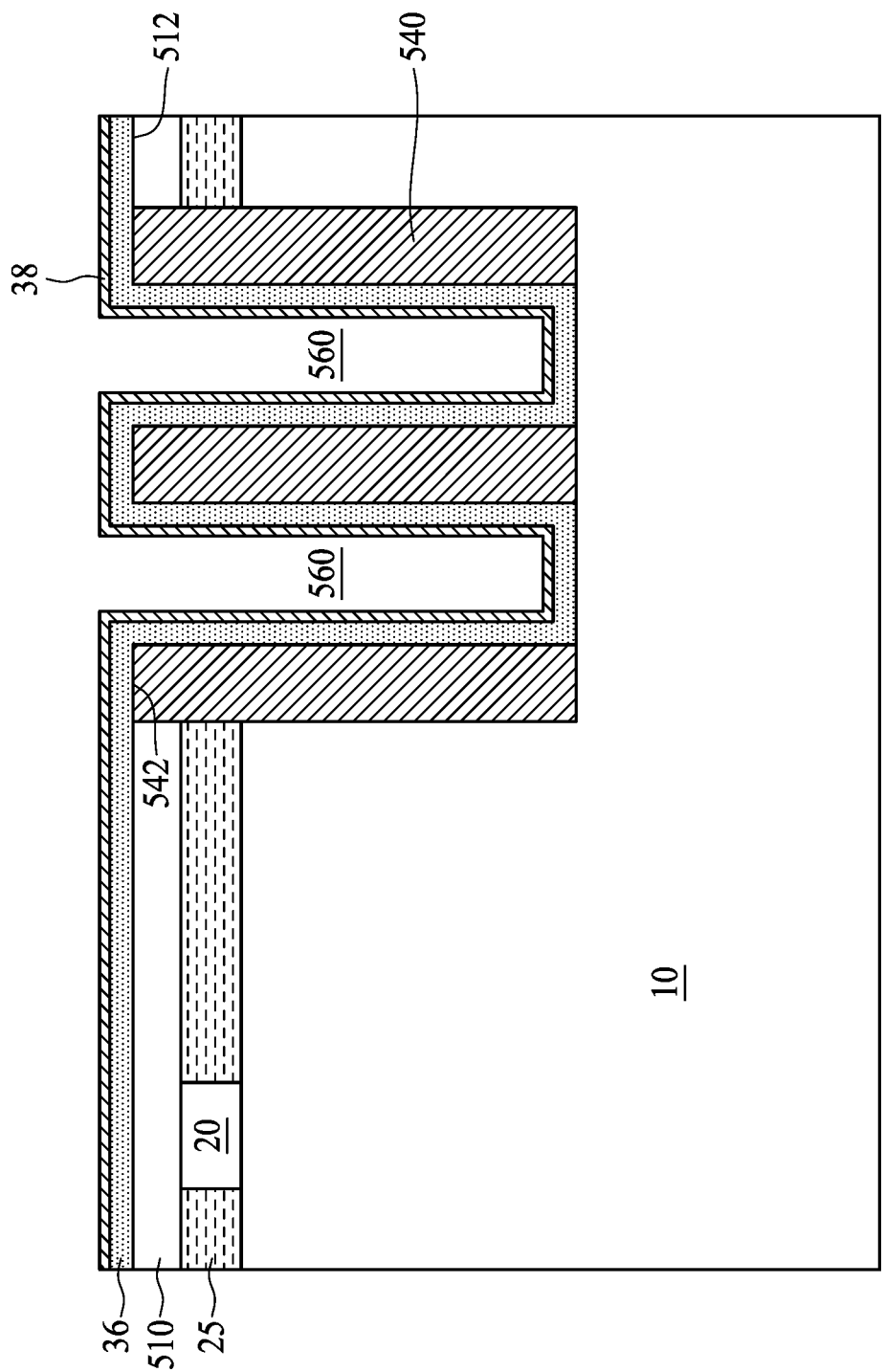

Referring to FIG. 19, in some embodiments, a seed layer 38 is optionally deposited on the barrier layer 36 according to a step 4212 in FIG. 3. In some embodiments, the seed layer 38 extends along an upper surface of the barrier layer 36 and in the trenches 560. In some embodiments, the seed layer 38 has a uniform thickness. In some embodiments, the seed layer 38 includes copper or copper alloys. In some embodiments, the seed layer 38 is formed through a sputtering process or a PVD process.

Figure 20:
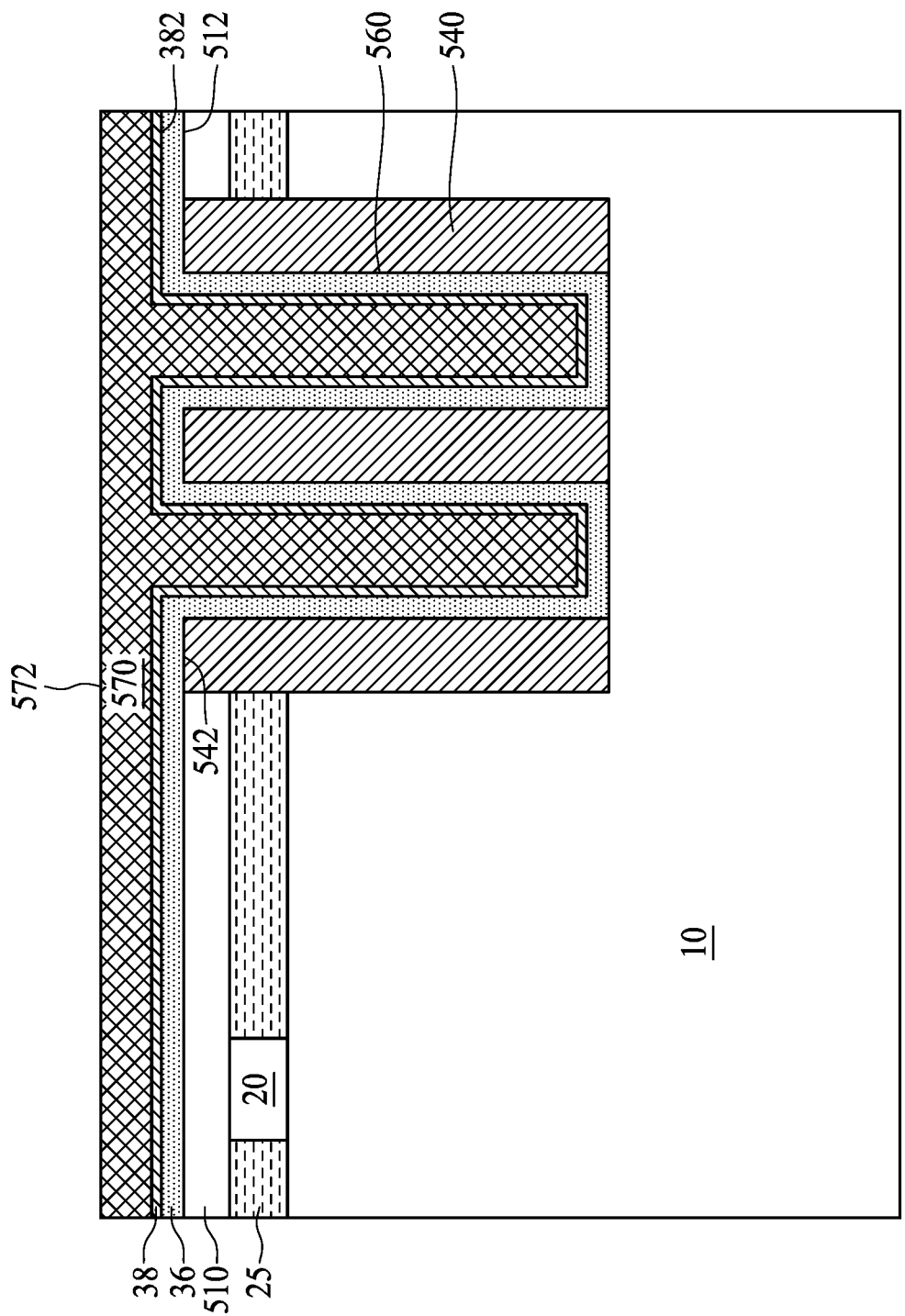

Referring to FIG. 20, in some embodiments, a conductive material 570 is formed on the seed layer 38 and deposited into the trenches 560 according to a step 422 in FIG. 3. In some embodiments, the conductive material 570 is deposited in the trenches 560 until an upper surface 572 of the conductive material 570 is higher than an upper surface 382 of the seed layer 38. In some embodiments, the conductive material 570 may extend over the upper surface 382. In some embodiments, the conductive material 570 may be formed using an electroplating process or a selective deposition process.

Figure 21:
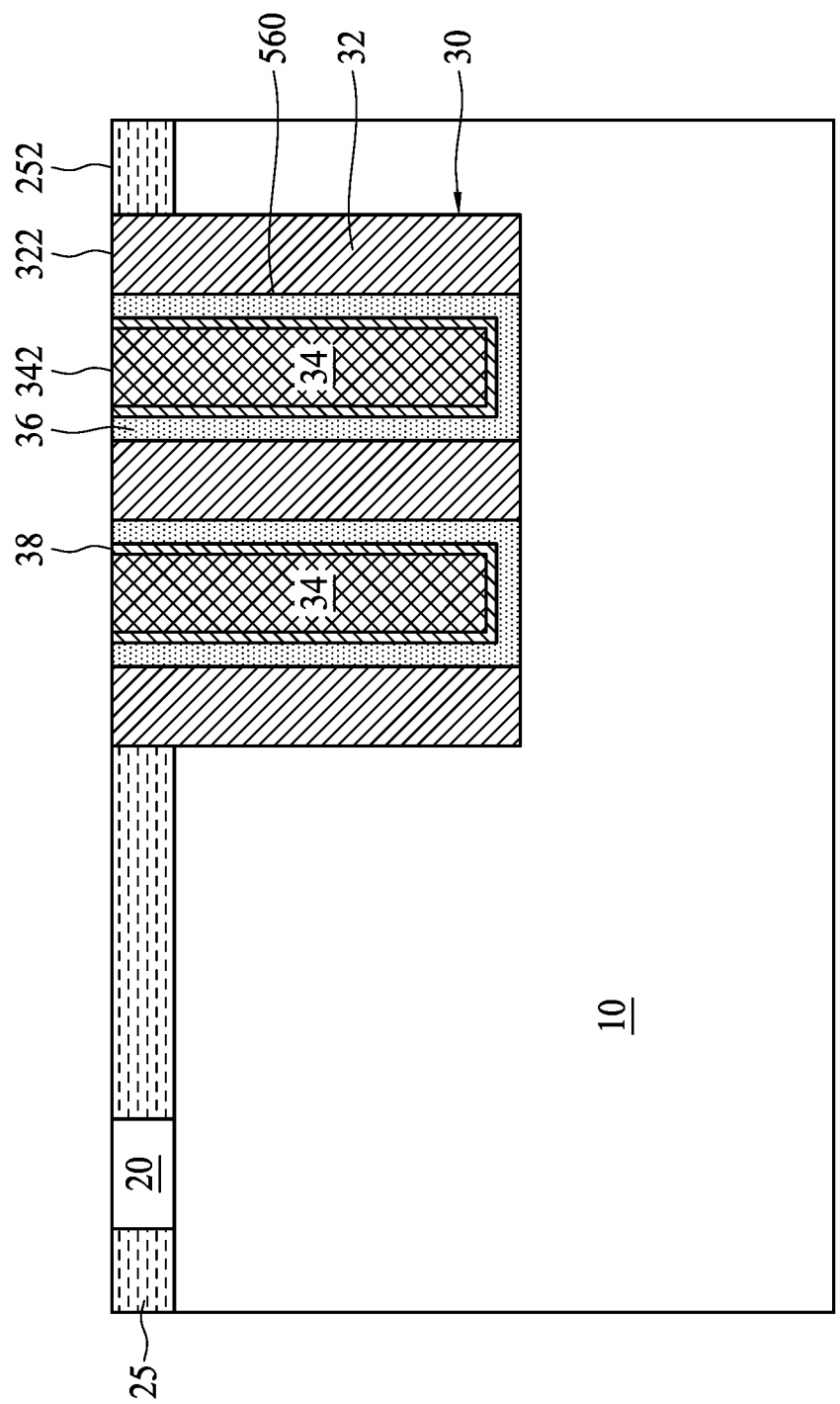

Referring to FIG. 21, in some embodiments, a second planarizing process is performed to expose the stop layer 510 according to a step 424 in FIG. 3. The stop layer 510 is then removed to expose the top surfaces 202 and 252 according to a step 426 in FIG. 3. Accordingly, the through silicon via structure 30 is formed. In the resulting structure, a top surface 322 of the remaining insulation layer 32 is coplanar with the top surface 252. In some embodiments, a top surface 342 of each of the conductive lines 34 is coplanar with the top surface 252. In some embodiments, the conductive lines 34 are connected to the semiconductor substrate 10. In some embodiments, the second planarizing process is, for example, a CMP process.

Next, a grinding process is performed according to a step 428 in FIG. 3. Accordingly, the semiconductor device 100 shown in FIG. 17 is completely formed. In some embodiments, the remaining semiconductor substrate 10 includes a rear surface 116 being coplanar with the bottom surface 344. In some embodiments, the rear surface 116 is coplanar with a bottom surface 324 of the insulation layer 32. In some embodiments, a height H of each of the conductive lines 34, measured from the top surface 342 to the bottom surface 344, is in a range of 30 to 50 micrometers.

One aspect of the present disclosure provides a semiconductor device. The semiconductor device includes a substrate and a through silicon via. The through silicon via structure is disposed in the substrate and includes an insulation layer and a plurality of conductive lines. The conductive lines extend from a top surface of the insulation layer to a bottom surface opposite to the top surface. The conductive lines are separated from each other by the insulation layer.

One aspect of the present disclosure provides a method of manufacturing a semiconductor device. The method includes steps of providing a substrate; forming an opening in the substrate; depositing an insulation layer in the opening; forming a plurality of trenches separated from each other in the insulation layer; and depositing a conductive material in the trenches.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a through silicon via structure disposed in the substrate, the through silicon via structure comprising:
a continuous insulation layer; and
a plurality of conductive lines extending from a top surface of the continuous insulation layer to a bottom surface opposite to the top surface and separated from each other by the continuous insulation layer, wherein the continuous insulating layer is in contact with each of the plurality of conductive lines;
a semiconductor component disposed on the substrate; and
a dielectric layer disposed on the substrate and encircling a sidewall of the semiconductor component, wherein the through silicon via structure penetrates through the dielectric layer;
wherein top surfaces of the semiconductor component, the dielectric layer, and each of the plurality of conductive lines are coplanar with the top surface of the continuous insulation layer, wherein a height of the semiconductor component is equal to a height of the dielectric layer, and the top surfaces of the semiconductor component and the dielectric layer are exposed;
wherein the semiconductor component is entirely embedded in the continuous insulating layer.

2. The semiconductor device of claim 1, wherein the continuous insulation layer penetrates through the substrate.

3. The semiconductor device of claim 2, wherein a bottom surface of the continuous insulation layer is coplanar with a rear surface of the substrate.

4. The semiconductor device of claim 3, wherein the bottom surfaces of the continuous insulation layer and the conductive lines are exposed.

5. The semiconductor device of claim 1, wherein a height of each of the plurality of conductive lines is in a range of 30 to 50 micrometers.

6. The semiconductor device of claim 1, further comprising a barrier layer disposed between the continuous insulation layer and the conductive lines.

7. The semiconductor device of claim 6, further comprising a seed layer disposed between the barrier layer and the conductive lines.

8. The semiconductor device of claim 1, wherein the continuous insulation layer is a spin-on-glass (SOG) layer.

* * * * *